United States Patent [19]
Horioka et al.

[11] Patent Number: 6,132,551
[45] Date of Patent: *Oct. 17, 2000

[54] INDUCTIVE RF PLASMA REACTOR WITH OVERHEAD COIL AND CONDUCTIVE LAMINATED RF WINDOW BENEATH THE OVERHEAD COIL

[75] Inventors: Keiji Horioka, Chiba; Haruo Okano, Narita, both of Japan

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,348

[22] Filed: Sep. 20, 1997

[51] Int. Cl.[7] .............................. C23C 16/48; C23F 1/02; C23F 1/08

[52] U.S. Cl. ............... 156/345; 204/192.32; 204/192.37; 204/298.31; 204/298.34

[58] Field of Search ......................... 204/192.32, 192.37, 204/298.31, 298.34; 156/345

[56] References Cited

U.S. PATENT DOCUMENTS

| | | |
|---|---|---|
| 4,123,316 | 10/1978 | Tsuchimoto . |
| 4,261,762 | 4/1981 | King . |
| 4,350,578 | 9/1982 | Frieser et al. . |

(List continued on next page.)

FOREIGN PATENT DOCUMENTS

| | | |
|---|---|---|
| 0 403 418 A2 | 12/1990 | European Pat. Off. . |
| 0 413 282 A2 | 2/1991 | European Pat. Off. . |
| 0 520 519 A1 | 12/1992 | European Pat. Off. . |
| 0 552 490 A1 | 7/1993 | European Pat. Off. . |
| 0 552 491 A1 | 7/1993 | European Pat. Off. . |
| 0 596 551 A1 | 5/1994 | European Pat. Off. . |
| 0 601 468 A1 | 6/1994 | European Pat. Off. . |
| 0 641 013 A2 | 3/1995 | European Pat. Off. . |
| 0 651 434 A2 | 5/1995 | European Pat. Off. . |
| 0 680 072 A2 | 11/1995 | European Pat. Off. . |
| 0 702 391 A2 | 3/1996 | European Pat. Off. . |
| 0 710 055 A1 | 5/1996 | European Pat. Off. . |
| 0 727 807 A1 | 8/1996 | European Pat. Off. . |
| 0 727 923 A1 | 8/1996 | European Pat. Off. . |
| 0 742 577 A2 | 11/1996 | European Pat. Off. . |
| 0 756 309 A1 | 1/1997 | European Pat. Off. . |
| 0 807 952 A2 | 11/1997 | European Pat. Off. . |
| 39 42964 A1 | 6/1991 | Germany . |
| 55-154582 | 12/1980 | Japan . |
| 57-155732 | 9/1982 | Japan . |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1977.

Matsu, Seitaro, "Selective Etching of SiO2 Relative to Si by Plasma Reactive Sputter Etching," *J. Vac. Sc. Technology*, vol. 17, No. 2, Mar.–Apr. 1980.

Lee, Ho–Jun, Yang, Dong–II and Whang, Ki–Woong, "The effects of magnetic fields on a planar inductively coupled argon plasma," *Plasma Sources Sci. Technol.*, 5(1996), pp. 383–388.

(List continued on next page.)

*Primary Examiner*—Christopher Raimund
*Attorney, Agent, or Firm*—Michaelson and Wallace

[57] ABSTRACT

The invention is embodied in an inductively coupled plasma reactor having a conductive enclosure defining a reactor chamber interior, the enclosure including a conductive layer, and an inductive antenna external of the reactor chamber interior and facing the interior through the conductive layer and being connectable to an RF power source, the conductive layer being sufficiently thin to permit an inductive field of the inductive antenna to coupled through the conductive layer into the reactor chamber interior. A wafer pedestal for supporting a semiconductive workpiece within the reactor chamber interior is connected to an RF bias power supply whereby a workpiece on the wafer support is a bias power electrode and the conductive layer is a bias power counter electrode, so that the entire reactor enclosure is a bias power counter electrode. Preferably, the bias power electrode is biased with respect to RF ground, and the conductive reactor enclosure including the conductive layer is grounded.

54 Claims, 4 Drawing Sheets

U.S. PATENT DOCUMENTS

| | | |
|---|---|---|
| 4,371,412 | 2/1983 | Nishizawa . |
| 4,427,516 | 1/1984 | Levinstein et al. . |
| 4,427,762 | 1/1984 | Takahashi et al. . |
| 4,430,547 | 2/1984 | Yoneda et al. . |
| 4,457,359 | 7/1984 | Holden . |
| 4,512,391 | 4/1985 | Harra . |
| 4,565,601 | 1/1986 | Kakehi et al. . |
| 4,579,080 | 4/1986 | Martin et al. . |
| 4,711,698 | 12/1987 | Douglas . |
| 4,755,345 | 7/1988 | Baity, Jr. et al. . |
| 4,756,810 | 7/1988 | Lamont, Jr. et al. . |
| 4,786,352 | 11/1988 | Benzing . |
| 4,786,359 | 11/1988 | Stark et al. . |
| 4,793,897 | 12/1988 | Dunfield et al. . |
| 4,807,016 | 2/1989 | Douglas . |
| 4,810,935 | 3/1989 | Boswell . |
| 4,842,683 | 6/1989 | Cheng et al. . |
| 4,870,245 | 9/1989 | Price et al. . |
| 4,918,031 | 4/1989 | Flamm et al. . |
| 4,948,458 | 8/1990 | Ogle . |
| 4,948,750 | 8/1990 | Kausche et al. . |
| 4,990,229 | 2/1991 | Campbell et al. . |
| 5,000,220 | 3/1991 | Wang et al. . |
| 5,006,220 | 4/1991 | Hijikata et al. . |
| 5,015,330 | 5/1991 | Okumura et al. . |
| 5,074,456 | 12/1991 | Degner et al. . |
| 5,085,727 | 2/1992 | Steger . |
| 5,169,487 | 12/1992 | Langley et al. . |
| 5,173,412 | 12/1992 | Kiener et al. . |
| 5,187,454 | 2/1993 | Collins et al. . |
| 5,203,956 | 4/1993 | Hansen . |
| 5,241,245 | 8/1993 | Barnes et al. . |
| 5,249,251 | 9/1993 | Egalon et al. . |
| 5,258,824 | 11/1993 | Carlson et al. . |
| 5,276,693 | 1/1994 | Long et al. . |
| 5,277,751 | 1/1994 | Ogle . |
| 5,326,404 | 7/1994 | Sato . |
| 5,346,578 | 9/1994 | Benzing et al. . |
| 5,349,313 | 9/1994 | Collins et al. . |
| 5,392,018 | 2/1995 | Collins et al. . |
| 5,399,237 | 3/1995 | Keswick et al. . |
| 5,401,350 | 3/1995 | Patrick et al. . |
| 5,414,246 | 5/1995 | Shapona . |
| 5,421,891 | 6/1995 | Campbell et al. . |
| 5,423,945 | 6/1995 | Marks et al. . |
| 5,468,341 | 11/1995 | Samukawa . |
| 5,477,975 | 12/1995 | Rice et al. . |
| 5,514,246 | 5/1996 | Blalock . |
| 5,529,657 | 6/1996 | Ishii . |
| 5,540,800 | 7/1996 | Qian ........................................ 156/345 |
| 5,556,501 | 9/1996 | Collins et al. |

FOREIGN PATENT DOCUMENTS

| | | |
|---|---|---|
| 61-147531 | 12/1984 | Japan . |
| 61-91377 | 5/1986 | Japan . |
| 61-142744 | 6/1986 | Japan . |
| 62-254428 | 11/1987 | Japan . |
| 63-9120 | 1/1988 | Japan . |
| 231197 | 8/1925 | United Kingdom . |
| 91/10341 | 7/1991 | WIPO . |
| WO 92/20833 | 11/1992 | WIPO . |
| WO 97/08734 | 3/1997 | WIPO . . |

OTHER PUBLICATIONS

Sugai, H. and Nakamura, K., "Diagnostics and Control of radicals in an inductively coupled etching reactor," *J. Vac. Sci. Technol.*, A 13(3), May/Jun. 1995, pp. 887–893.

Horiike, Yashuiro, Kazuhiro, Shindo, Haruo and Kukasawa, Takayuki, "High rate and highly selective SiO2 etching employing inductively coupled plasma and discussion on reaction kinetics," *J. Vac. Sci. Technol.*, May/Jun. 1995, pp. 801–809.

Lieberman, M.A. and Ashida, S., "Global models of pulse–power–modulated high–density, low pressure discharges," *Plasma Sources Sci. Technol.*, 5(1996), pp. 145–158.

Samakawa, Seiji and Ohtake, Hiroto, "Pulse–time Modulated Plasma Etching for Precise ULSI Patterning," Abstract No. 162, *Microelectronics Research Laboratories*, NEC Corporation, Japan, May 1996, pp. 217–218.

Shibano, Teruo, Fujiwara, Nobuo, Hirayama, Makoto, Nagata, Hitoshi and Demizo, Kiyoshi, "Etching yields of SiO2 by low energy CF+x and Fx ions," *Appl. Phys. Lett.*, vol. 63, No. 17, Oct. 25, 1993.

Tynan, G.R., Bailey, A.D. III, Campbell, G.A., Charatan, R., de Chambrier, A., Gibson, G., "Characterization of an Azimuthally Symmetric helicon Wave High Density Plasma," *Trikon Technologies, Inc.*, Japan, Jul. 1997.

European Patent Office Communication Pursuant to Article 96(2) and Rule 51(2) EPC for Application No. 94307307.2–22–8, mailed Jan. 1996.

Patent Abstracts of Japan, Publication No. 57045927 A, Mar. 16, 1982 (Fujitsu Ltd).

Patent Abstracts of Japan, Publication No.06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst:KK).

Patent Abstracts of Japan, Publication No. 62052714 A, Mar. 7, 1987 (Olympus Optical Co. Ltd; Toagosei Chem Ind Co Ltd).

INDUCTIVE RF PLASMA REACTOR WITH OVERHEAD COIL AND CONDUCTIVE LAMINATED RF WINDOW BENEATH THE OVERHEAD COIL

TECHNICAL FIELD

The present invention pertains to an inductively coupled plasma reactor for plasma processing of microelectronic devices, such as semiconductor integrated circuit substrates or liquid crystal display substrates.

BACKGROUND ART

In general, in an inductively coupled reactor, radio frequency (RF) plasma source power is applied to an antenna set outside an evacuated chamber, and power is inductively coupled from the antenna through an RF window, e.g., a dielectric material, forming a part of the aforementioned evacuated chamber. In this way, the plasma can be maintained. In such a reactor, the plasma can be maintained at a high ion density at a relatively high vacuum (about $10^{-3}$ Torr). Consequently, the direction of the ions incident to the substrate under processing is predominantly perpendicular to the substrate surface. As a result, RF plasma source power can be of a high frequency. The high ion density provides high-speed processing. When the inductively coupled plasma is used for the dry etching, bias RF power must be applied to the substrate to control ion energy. An RF bias current flows from the substrate into the plasma through the cathode sheath and then flows from the plasma into the wall of the evacuated chamber through the anode sheath. In this case, since the area of the evacuated chamber acting as the anode is substantially larger (e.g., 3–5 times) than the area of the susceptor electrode acting as the cathode, the potential difference between the plasma and the evacuated chamber is relatively small, while the potential difference between the plasma and the cathode is relatively large. Consequently, the energy of the ions impinging on the substrate is relatively large, leading to a high etching efficiency. Furthermore, since the voltage on the side of the anode sheath is relatively low, ion sputtering of the evacuated chamber, contamination caused by the products of such sputtering and other adverse effects are inhibited.

Because the induced electromagnetic field cannot pass through the interior of a typical conductor, a dielectric (insulator) such as fused silica and ceramic has been used as the RF window of the inductively coupled plasma reactor. Because the RF bias current does not flow through this part, its area is not included in the area of the anode. Consequently, when the area of the RF window is enlarged to accommodate a large coil antenna for processing a large wafer, the anode/cathode area ratio is reduced, thereby reducing the desired effects discussed above.

Figure 1:
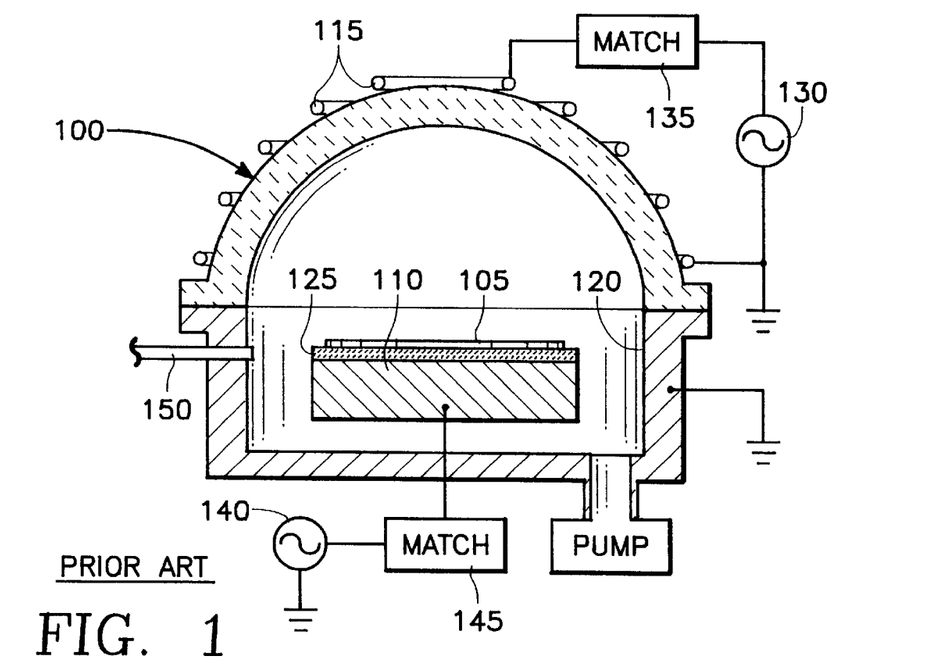
FIG. 1 is a cut-away side view of a plasma reactor of the prior art.

Referring now to the conventional inductively coupled plasma reactor of FIG. 1, a hemispherical RF window 100 is positioned facing a substrate 105 supported on a wafer pedestal 110, and a helical coil antenna 115 is set outside RF window 100, being wound in a helix whose axis of symmetry coincides with the axis of symmetry of the hemispherically shaped RF window 100. A conductive (metallic) cylindrical side wall 120 supports the hemispherical RF window 100. The wafer pedestal 110 can support an electrostatic chuck 125 for holding the wafer 105 in place. An RF plasma source power supply 130 furnishes RF plasma source power, for example at 13.56 MHz, to the coil antenna 115 through an RF impedance match circuit 135. An RF plasma bias power supply 140 furnishes RF plasma bias power to the wafer pedestal 110 through an RF impedance match circuit 145. The chamber side wall 120 is grounded to provide an RF return for the bias power applied to the wafer pedestal 110.

Since RF window 100 is a dielectric material, the anode consists solely of the conductive (metallic) wall 120 of the evacuated chamber, which unfortunately presents a relatively small area to the plasma. In this case, the area of the anode is almost as small as that of the cathode. As a result, the potential difference between the plasma and the cathode becomes so small that the etching rate is reduced. On the other hand, the potential difference between the plasma and the anode is large. As a result, ion sputtering of the chamber wall 120 is more intense so that wear of the evacuated chamber wall 120 and consequent metal contamination on the substrate 105 are aggravated.

Typically, the RF window 100 consists solely of a dielectric such as alumina. The area ratio of the top surface (the portion acting as an electrode) of the wafer pedestal (susceptor) 110 to the chamber wall 120 is about 2.0. (Interestingly, the area ratio of the susceptor 110 to the RF window is about 4.5.)

Table I shows the relationship between the self-bias voltage V on the substrate or silicon wafer 105 and the bias power density (W/cm$^2$). In the example of Table I, the internal pressure is kept at 10 mTorr, an etching gas mixture of 5 parts CHF3 and 1 part Ar for etching a silicon oxide film is fed into reaction chamber from a gas inlet 150 at a gas flow rate of 200 sccm, and RF plasma source power of 3 kW is applied to the antenna 115 to maintain a plasma.

TABLE I

| Bias Power Density (W/cm$^2$) | Self Bias Voltage on Wafer (volts) |
|---|---|
| 0.5 | 150 |
| 1.0 | 260 |
| 2.0 | 440 |
| 3.0 | 620 |
| 4.0 | 800 |

In this example, the self-bias voltage is the time average of the bias voltage generated on the silicon wafer 105 capacitively connected to the wafer pedestal (susceptor electrode) 110 through the insulation layer of the electrostatic chuck 125. In this example, when ion scattering is negligible under a relatively low pressure, the self-bias voltage approximately corresponds to the average energy of the ions accelerated from the plasma to silicon wafer 105.

Etching of the silicon oxide film requires bombardment of the ions with relatively high kinetic energy to induce the etching reaction. In the foregoing example, a self-bias voltage of 600 V is needed. Consequently, as can be seen from Table I, a bias power density of about 3 W/cm$^2$ is needed for conventional dry etching device having a purely dielectric RF window 100. Because the working area of the upper surface of the wafer pedestal (susceptor electrode) 110 must be larger than that of wafer 105, the area of the susceptor electrode is in the range of 300–400 cm$^2$ for a 200 mm diameter silicon wafer. Consequently, as can be seen from Table I, when the area of the susceptor's upper surface is 400 cm', it is necessary to apply a total bias power of 1.2 kW between the susceptor electrode 110 acting as the cathode and the chamber wall 120 acting as the anode.

When such a high bias power is applied, the temperature of the silicon wafer 105 rises significantly. The etching rate of the photoresist film used as the etching mask increases, and the selection ratio decreases. In addition, because the bias power with 30–40% of the energy applied to the antenna 115 is consumed in heating the plasma, the electron temperature tends to rise.

In order to increase the anode/cathode area ratio to ameliorate the foregoing problems, the chamber volume can be enlarged by increasing its height or radius of evacuated chamber. But, this expedient requires a vacuum pump with a large exhaust capacity.

SUMMARY OF THE INVENTION

The invention is embodied in an inductively coupled plasma reactor having a conductive enclosure defining a reactor chamber interior, the enclosure including a conductive layer, and an inductive antenna external of the reactor chamber interior and facing the interior through the conductive layer and being connectable to an RF power source, the conductive layer being sufficiently thin to permit an inductive field of the inductive antenna to coupled through the conductive layer into the reactor chamber interior.

A wafer pedestal for supporting a semiconductive workpiece within the reactor chamber interior is connected to an RF bias power supply whereby a workpiece on the wafer support is a bias power electrode and the conductive layer is a bias power counter electrode, so that the entire reactor enclosure is a bias power counter electrode. Preferably, the bias power electrode is biased with respect to RF ground, and the conductive reactor enclosure including the conductive layer is grounded.

In a preferred implementation, the reactor enclosure includes a metallic cylindrical side wall and a ceiling underlying the coil antenna, the conductive layer residing in the ceiling. The conductive layer generally spans the ceiling whereby to provide a conductive area corresponding to that of the ceiling.

Preferably, the conductive layer has a thickness less than a skin depth of the inductive field of the coil antenna, preferably orders of magnitude thinner than the skin depth. On the other hand, the conductive layer is sufficiently thick to minimize electrical potential differences across the conductive layer, preferably sufficiently thick to provide an electrical resistivity of less than 100 Ohms/square cm across the conductive layer. To meet both criteria, the conductive layer is between about 4 and 3000 angstroms thick for a typical inductive field frequency.

In a preferred embodiment, the ceiling is a laminated multilayer RF window wherein the conductive layer includes one layer of the laminated multilayer RF window. The RF window includes an outer dielectric body layer and an inner protective layer, the conductive layer being between the outer and inner layers. The capacitance of the protective layer preferably matches the capacitance across the plasma sheath.

DETAILED DESCRIPTION OF THE PREFERRED EMBODIMENTS

A self-bias wafer voltage of 600 V can be generated at a bias power density of 1.0 W/cm' or lower using dry etching device which has laminated window disclosed in this invention. Consequently, the power applied overall to susceptor can be reduced to 400 W or less, which is about 13% of the power applied to RF antenna.

Figure 2:
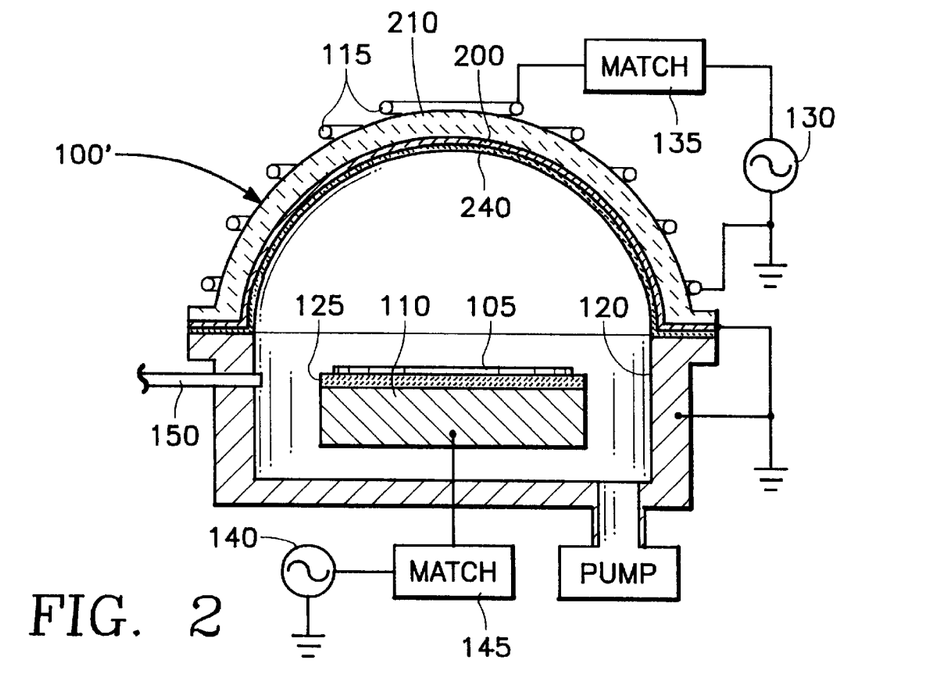
FIG. 2 is a cut-away side view of a plasma reactor incorporating a laminated RF window in accordance with a first embodiment of the invention.

FIG. 2 illustrates a first preferred embodiment of the present invention, in which the purely dielectric RF window 100 (of FIG. 1) is replaced by a laminated RF window 100' containing a thin conductive film or layer 200. The conductive layer 200 is sufficiently thin to permit RF power from the coil antenna 115 to inductively couple through the conductive layer 200 into the interior of the reactor chamber. In one exemplary embodiment illustrated in FIG. 3, the laminated RF window 100' includes a structural layer of alumina 210, a 100-angstrom-thick titanium nitride film 220, a 200-angstrom-thick titanium film as the thin conductive layer 200, and a 100-angstrom-thick titanium nitride film 230. The inner titanium nitride layer 220, the encapsulated titanium layer 200 and the outer titanium nitride layer 230 are formed sequentially on the interior surface of the structural alumina layer 210 using an appropriate method, such as a sputtering method. In addition, a 300-micron-thick alumina film 240 is coated on the inner surface of titanium nitride film 230 using a plasma flame spray coating method. The titanium layer 200 is an electroconductive film and is grounded together with chamber wall 120 of FIG. 2. The titanium nitride films 220 and 230 above and below titanium film 200 are barrier layers for preventing the deterioration of the titanium layer 200 from reaction with the oxygen atoms in the alumina ceramics.

Table II compares the relationship between the self-bias voltage V on the substrate or silicon wafer 105 and the bias power density (W/cm$^2$) exhibited by the embodiment of the invention illustrated in FIG. 2 with that exhibited by the conventional plasma reactor of FIG. 1. In the comparative examples of Table I, the internal reactor chamber pressure is maintained at 10 mTorr, an etching gas mixture of 5 parts CHF3 and 1 part Ar for etching a silicon oxide film is fed into reaction chamber from a gas inlet 150 at a gas flow rate of 200 sccm, and RF plasma source power of 3 kW is applied to the antenna 115 to maintain a plasma. The comparison of Table II shows that the invention achieves a significant increase in self bias voltage on the wafer for a given bias power level. This in turn reduces the required bias power density, a significant advantage.

TABLE II

| Bias Power Density | Self Bias Voltage on Wafer (volts) | |
|---|---|---|
| (W/cm$^2$) | Window w/Conductor | Conventional Window |
| 0.5 | 490 | 150 |
| 1.0 | 680 | 260 |
| 2.0 | 800 | 440 |
| 3.0 | 950 | 620 |
| 4.0 | 1080 | 800 |

Table III compares the etch performance of the embodiment of the present invention illustrated in FIG. 2 with that of the conventional plasma reactor of FIG. 1. For the conventional plasma reactor of FIG. 1, when a high bias power of 1200 W is applied to the wafer pedestal or susceptor 110, the etching rate is 1050 nm/min, which is relatively high, and the selection ratios with respect to the photoresist and silicon are as low as 6.2 and 18, respectively. In contrast, in the embodiment of the invention illustrated in FIG. 2, when a small bias power of 400 W is applied to the susceptor 110, the etch rate is relatively low, and the selection ratios increase by a factor of 2 or 3, a remarkable improvement.

TABLE III

| | Laminated RF Window | Conventional RF Window |
|---|---|---|
| Bias Power | 400 W | 1200 W |
| Self-bias Voltage | 600 V | 600 V |
| Etch Rate | 900 nm/min | 1050 nm/min |
| Photoresist selectivity | 15.6 | 6.2 |
| Silicon selectivity | 46 | 18 |

The RF power inductively coupled from the coil antenna 115 is attenuated by the plasma so that its penetration is negligible beyond a depth of about 20 mm below the interior surface of the RF window 100 or 100'. Consequently, the region where the RF is absorbed to generate the plasma is confined within a range of about 10–20 mm below the interior surface of RF window 100 or 100'. The electrons in this plasma generation region have a relatively high average kinetic energy, which is in the range of about 4–8 eV. The distance from the plasma generation region to the wafer 105 is about 100 mm. Because the mean free path of the electrons heated by the electromagnetic field in the plasma generation region is several millimeters, the electrons are able to disperse toward the plasma sheath near the silicon wafer 105 while repeating a staggering movement at a distance of several millimeters each RF cycle. While dispersing, the electrons lose energy after colliding with the gas molecules during this period. As a result, the plasma near the wafer surface contains only low energy electrons. This predominance of low energy electrons at the wafer surface is advantageous because the directivity of high energy electrons is highly random. If such high energy electrons were incident on silicon wafer 105 having a narrow groove or hole, many of the electrons having a non-perpendicular direction of travel relative to the wafer surface never reach the bottom of the hole or groove, while a far higher proportion of the ions do reach it. Therefore, a charge imbalance arises between the electrons and the ions, leading to a positive charge on the bottom or side wall of the groove or the hole. This positive charge repels the etchant ions or radicals, slowing down the etch rate. This makes the etch rate dependent upon the aspect ratio of holes and groves in the wafer, a significant problem.

In the conventional reactor of FIG. 1, such problems were addressed by placing the silicon wafer 105 well-below the plasma generation region. However, since it is necessary to apply a relatively high bias power in conventional the conventional reactor of FIG. 1, the electron temperature is nevertheless high, so that the problem was not really solved in the conventional reactor of FIG. 1.

In contrast, in the embodiment of the invention of FIG. 2 employing the laminated RF window 100', the required RF bias power is relatively small, as discussed above, so that the electrons are not as energized. Table IV compares electron temperatures achieved in the embodiment of the invention illustrated in FIG. 2 with those achieved in the conventional reactor of FIG. 1.

TABLE IV

| | Laminated RF Window | | Conventional RF Window | |
|---|---|---|---|---|
| Bias Power | 0 W | 400 W | 0 W | 1200 W |
| Electron Temp. | 1.2 eV | 2.0 eV | 1.5 eV | 4.0 eV |
| Breakdown Rate | 0% | 0% | 0% | 20% |
| Defective Openings | — | 3.1% | — | 100% |

As shown in Table IV, a low electron temperature can be realized in the invention even when no bias power is applied. Since a relatively high voltage in the range of 2–10 kV is generated between the two ends of RF antenna 115 on the outside, the electric field generated by antenna 115 can capacitively couple into the interior of the reactor chamber through the purely dielectric conventional window 100 of FIG. 1. As a result, a relatively high electric field is formed in the plasma near the end portions of antenna 115. This electric field is the main cause of the increase in the electron temperature. On the other hand, when the laminated window 100' of FIG. 2 is used, the electric field cannot readily capacitively coupled to the interior of reaction chamber because it is attenuated or even blocked by conductive titanium film 200. Consequently, the embodiment of the invention illustrated in FIG. 2 provides a lower electron temperature near the wafer surface so that etch rate is not as dependent upon device geometry, a significant advantage. Specifically, the electron temperature in conventional reactor is 4.0 eV, while the electron temperature in the invention is reduced by half to 2.0 eV.

Table IV also lists the electrostatic breakdown rate with respect to a MOS element. The element used for this evaluation is prepared by forming a resist pattern with an aspect ratio of 5 on a MOS capacitor of the polysilicon electrode type. The configuration of this element is sensitive to the influence of the distribution of the angles of incidence of the electrons and ions. When measured by voltage resistance, a plasma-treated MOS insulating film with a voltage resistance of 8 MV/cm or lower is considered defective. When the laminated RF window 100' of the invention is used, there is no defectiveness, regardless of whether the bias power is applied. In contrast, when conventional purely dielectric RF window 100 of FIG. 1 is used, a defective rate of about 20% is observed when bias power is applied to the susceptor 110.

Table IV also lists the results of measuring the defective conduction rate when processing and opening the contact hole. In this test, after a 2.1-mm-thick silicon oxide film is deposited on the silicon wafer 105, a resist pattern with a line width of 0.40 mm is printed, followed by etching. Subsequently, a metal wiring layer is embedded to check whether the element is electroconductive. Each test pattern has about 10,000 contact holes, which are connected to each other in the pattern of a straight chain. Consequently, the element will be electroconductive only if all of the holes in the test pattern are opened. When the laminated RF window 100' of the invention is used, the defective rate is as low as 3.1%. This is a good result in view of the fact that the defects are mainly caused by the particles attached to silicon wafer 105. On the other hand, when the conventional purely dielectric RF window 100 of FIG. 1 is used, opening defects are observed in all of the test patterns.

As alluded to previously in this specification, a low electron temperature (kinetic energy) near the wafer surface is advantageous because low energy electrons travel predominantly in a direction perpendicular to the wafer surface, so that they tend to travel all the way to the bottom of narrow features and thereby prevent a positive charge build-up. When the electron temperature is high, electron directionality is more random, less electrons travel in the perpendicular direction so that less electrons can reach the bottom of narrow features. The positively charged ions do not have such a random directionality, so that a positive charge build-up occurs at the bottom of narrow features (grooves or holes). As a result, an electric field holding back the ions is formed near the bottoms of the holes, hindering and even stopping the etch process under certain conditions.

The foregoing shows that using the laminated RF window 100' of FIG. 2 with the silicon wafer 105 set well below the plasma generation region prevents the electron temperature from rising as bias power is applied and improves etch performance. These advantages are maximized by adjusting the chamber pressure so that the distance between the plasma generation region and the silicon wafer 105 is about one order of magnitude or more greater than the electron mean free path length.

In a preferred implementation, the RF plasma source power supply provides an amplitude modulated RF signal to the coil antenna 115. Such modulation is another way of maintaining a low electron temperature. The electron temperature can be reduced efficiently by interrupting or modulating the RF at an interval in the range of 10–100 msec. This technique is also effective in preventing the electrons from reheating due to application of the bias RF.

In addition, sputtering-induced loss or wear of the chamber interior surfaces is reduced by using the laminated RF window 100' of FIG. 2 because the energy of the ions colliding with the interior surfaces is reduced significantly, for two reasons:

(1) As described above, a high voltage of several kilovolts is generated between the two ends of RF antenna 115. When the conventional purely dielectric RF window 100 of FIG. 1 is used, an electric field with a high density of several kV/cm is formed in the plasma sheath near the interior surface of the window 100 near the end portions of antenna 115. As a result, the ions in the plasma are accelerated toward the window 100. Consequently, physical sputtering caused by the high-energy ions becomes inevitable even for a chemically-stable material like alumina. On the other hand, when the laminated RF window 100' of FIG. 2 is used, capacitive coupling of the high electric field between the end portions of the antenna is attenuated or blocked by the conductive titanium film 200 from the bulk of the plasma generation region. Consequently, the potential difference between the inner surface of laminated RF window 100' and the plasma is almost equal to the plasma potential (Vp), which reduces or prevents sputtering of the interior surface of the laminated RF window 100'.

(2) When the laminated RF window 100' is used, both chamber wall 120 and the conductive titanium layer 200 act as ground electrodes with respect to the bias RF power. As a result, the area of the ground electrodes facing the plasma is much greater (than in the conventional reactor of FIG. 1), restraining both the DC component and AC component (variable component) of the plasma potential (Vp). Consequently, the energy of the ions is correspondingly low.

Another advantage of the invention is that it reduces metal contamination of the silicon wafer 105. The performance of a Si-MOS device will be hindered significantly by any alkali metal and heavy metal contaminants on its surface. Consequently, in an etch process, it is necessary to limit the amount of the contaminants on the wafer surface to about $10^{10}/cm^2$. The problem is that the materials of the chamber interior surfaces, including the chamber wall 120, contain a large amount of such metallic elements acting as the contamination sources, and these materials are sputtered or worn off by the plasma to contaminate the wafer 105. However, when laminated RF window 100' of the invention is used, the contamination caused by heavy metals, such as Fe and Cr, and light metals, such as Na, are reduced typically by a factor of about ten.

Figure 3:
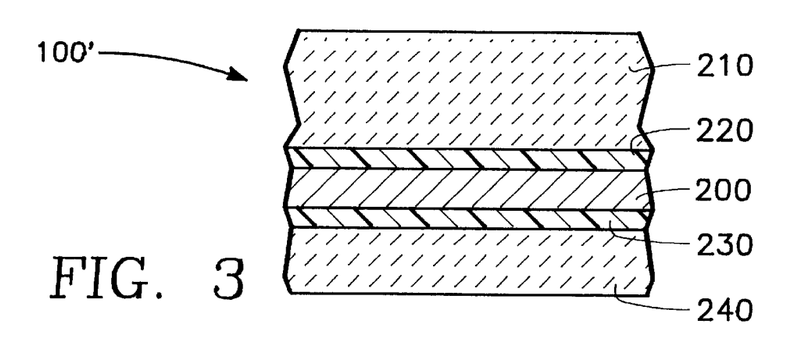
FIG. 3 is a partial cut-away side view corresponding to FIG. 2 illustrating in detail the multilayer structure of the laminated RF window.

The optimum thickness of conductive titanium film 200 in the laminated RF window 100' is selected to be (1) sufficiently thin to permit the RF field from the coil antenna 115 to inductively couple through the film 200 into the chamber interior, and (2) sufficiently thick to provide good conductivity for avoiding significant electrical potential differences across its surface that would adversely affect the plasma. Thus, the thickness of the titanium film 200 is constrained to be less than a maximum thickness for RF field transmission and greater than a minimum thickness for avoiding potential differences across its surface. In the following study, the presence of titanium nitride films 220, 230 will not be taken into consideration because they are too thin to affect the transmissivity of the RF electromagnetic field.

An index for the transmissivity of the RF electromagnetic field is the metal's skin depth, which is a function of the frequency of the induced electromagnetic field to be transmitted as well as the resistivity and permeability of the metal film. Skin depth (d) is defined by the following formula:

$$d = (2/\omega\mu\rho)^{1/2}$$

where $\omega$, $\mu$ and $\rho$ represent, respectively, the angular oscillation frequency of the RF field, the permeability of the metal film, and the conductivity of the metal film.

In general, an electromagnetic wave cannot penetrate through a relatively thick conductor. In particular, when the thickness of the metal film exceeds the skin depth, the electromagnetic wave is almost completely blocked. Therefore, the maximum optimal thickness of the conductive layer 200 is on the order of the skin depth. For a transmissivity of 90% to 99%, it is preferred that the thickness of the conductive titanium film be in the range of 1/1000–1/100 of the skin depth. For example, the skin depth of titanium is about 30 microns with respect to a 13.56-Mhz RF field, so that the maximum conductive film thickness would preferably be between about 0.03 microns and 0.3 microns.

The optimal minimum thickness is selected to minimize in-plane electrical potential differences across the conductive film 200. This depends not only upon the film thickness (resistivity) but also upon the RF bias current, the shape of laminated RF window 100' and the manner of connecting the conductive film 200 to ground. Roughly speaking, the best results are realized if the resistivity is less than on the order of about 100 Ω/cm². If the conductive film 200 is titanium, then the foregoing constraint is satisfied if the film thickness is 4 angstroms or more. Generally, a thickness range of the conductive titanium film is about 4–3000 angstroms, or, more practically, 10–3000 angstroms.

The alumina film 240 on the innermost surface of the laminated RF window 100' of FIG. 2 protects the titanium layer 200 from highly-corrosive/etch precursors, including fluorine, chlorine, and other halogens as well as oxidizing gases such as oxygen or nitrogen dioxide.

The alumina layer 240 is a dielectric and acts as a capacitance resistor sandwiched between the conductive titanium film 200 and the plasma. If the alumina layer 240 is too thick, the impedance to the RF bias power increases, decreasing the desired effects of the conductive titanium film 200. This problem is avoided by limiting the thickness of the alumina layer 240 so that the capacitance of said alumina film 240 is equal to or greater than that of the plasma sheath formed between the plasma and laminated RF window 100'. The thickness of the plasma sheath is in the range of 1–0.1 mm for low-temperature plasma with an ion density between about $10^9$/cm³ and $10^{10}$/cm³. Consequently, the thickness T of the alumina layer 240 is selected such that the effective thickness T/$\epsilon$ is smaller than the thickness of the aforementioned plasma sheath, where $\epsilon$ is the dielectric constant of the alumina film. Table V sets forth the preferred material thicknesses for different plasma ion densities.

TABLE V

| Plasma ion density (1/cm³) | $10^9$ | $10^{10}$ | $10^{11}$ |
|---|---|---|---|
| Effective dielectric thickness T/$\epsilon$ (mm/$\epsilon$) | 1 | 0–3 | 0.1 |
| Maximum alumina thickness (mm) | 9 | 3 | 0.9 |
| Maximum titania thickness (mm) | 80 | 23 | 8 |

Alumina is not the only choice for the protective film 240. It is possible to increase the thickness of the protective film by using a material with a higher dielectric constant under the same plasma conditions. In particular, when the thickness exceeds 1 mm, the protective film can be a ceramic film formed by means of sintering. When the thickness exceeds 10 mm, it becomes possible to maintain the pressure difference between the inside and outside of the reaction chamber in this portion alone. In such a case, a ceramic film with high dielectric constant, such as a ceramic film made of titania, is used as the protective film, and the titanium film 200 is formed on the exterior surface of the laminated RF window 100'.

Figure 4:
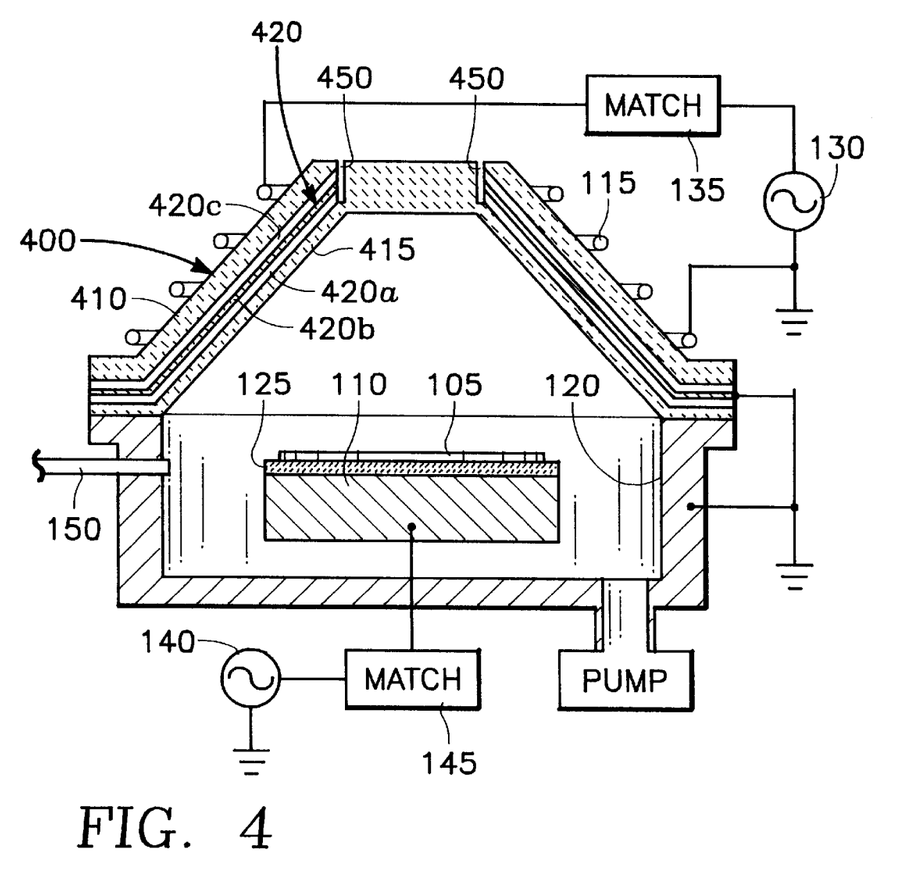
FIG. 4 is a cut-away side view of a plasma reactor incorporating a laminated RF window in accordance with a second embodiment of the invention.

FIG. 4 illustrates another embodiment of the invention in which the laminated RF window is a truncated conical laminated RF window 400 (instead of a hemisphere), and the coil antenna 115 is wound outside the surface of the cone. Preferably, the laminated RF window 400 includes a dielectric window body 410 and a protective film 415. The dielectric window body 410 and the protective film 415 are sintered alumina containing a very small amount of titanium. The dielectric constant can be increased by adding titanium into the main ingredient of alumina.

The protective film 415 is formed first as a 3-mm thick sintered alumina layer with a dielectric constant of 50. Subsequently, a multilayer film 420 including a titanium nitride film 420a, a titanium film 420b, and another titanium nitride film 420c are formed in sequence on the cone-shaped outer surface of the protective film 415. Then, the window body 410 is formed as a 10-mm-thick sintered alumina layer

410 and is bonded to the outer surface of the multilayer film 420 to form the laminated RF window 400 of FIG. 4.

As shown in FIG. 4, there are gaps 450 in the top portion of window body 410 on the outermost side. In this way, the allowable error generated during the processing can be corrected by making upward or downward adjustment, and the remaining air or other gases can escape through the gaps 450 when the sintered alumina layer is bonded. Consequently, no bubble is formed, and the peeling of the bonded portion can be prevented.

This manufacturing method is characterized by the fact that the inner surface in contact with the plasma can be formed using a sintered body for which the composition can be controlled, and the processing can be performed easily. Consequently, this method is particularly suitable for forming a laminated RF window.

Figure 5:
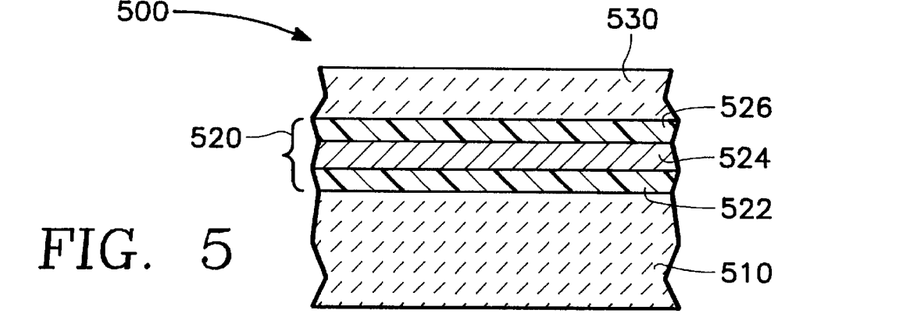
FIG. 5 is a partial cut-away side view corresponding to FIG. 4 illustrating in detail another multilayer structure of the laminated RF window.

FIG. 5 illustrates the detailed multilayer structure of a laminated RF window 500 in accordance with another embodiment employing a sintered body used as the dielectric material. First, a 15-mm-thick titania sintered body 510 with a dielectric constant of 80 is formed on the side exposed to the plasma and is the protective film. It is the window body for supporting the remainder of the multilayer structure. Subsequently, a multilayer film 520 consisting of a titanium nitride film 522, a titanium film 524 and a titanium nitride film 526 is formed (in that order) on the outer surface of titania sintered body 510. A silicate glass coating 530 is formed on the outer surface of the multilayer film 520 to protect it from the moisture and oxygen in the air.

The interior surface of the protective film 510 (which contacts the plasma) can be formed using a sintered body for which the composition and purity can be controlled easily, and the laminated window 500 can be molded to various configurations because its structure is relatively simple. The aforementioned structure is particularly suitable for surface treatment not requiring a high-density plasma formed by applying high plasma source power.

Figure 6:
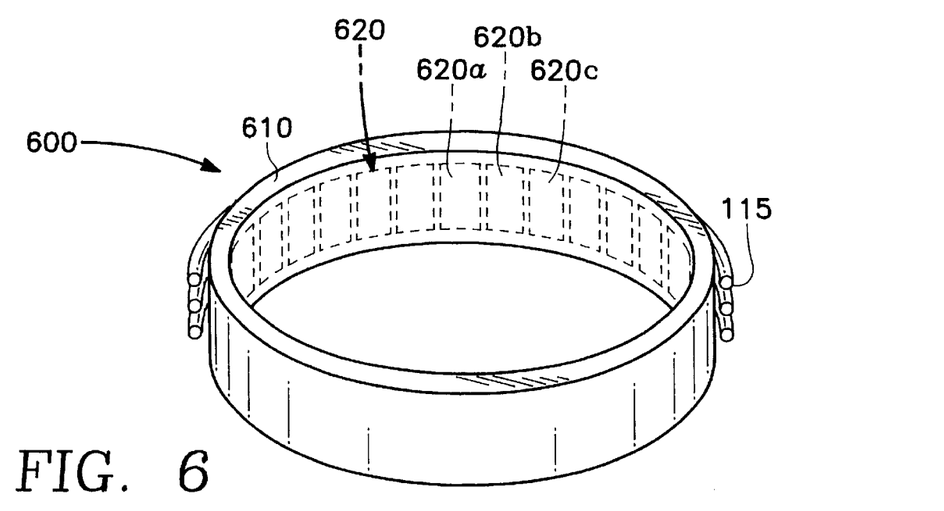
FIG. 6 is a perspective view of a portion of a plasma reactor incorporating a laminated RF window in accordance with a third embodiment of the invention.
Figure 7:
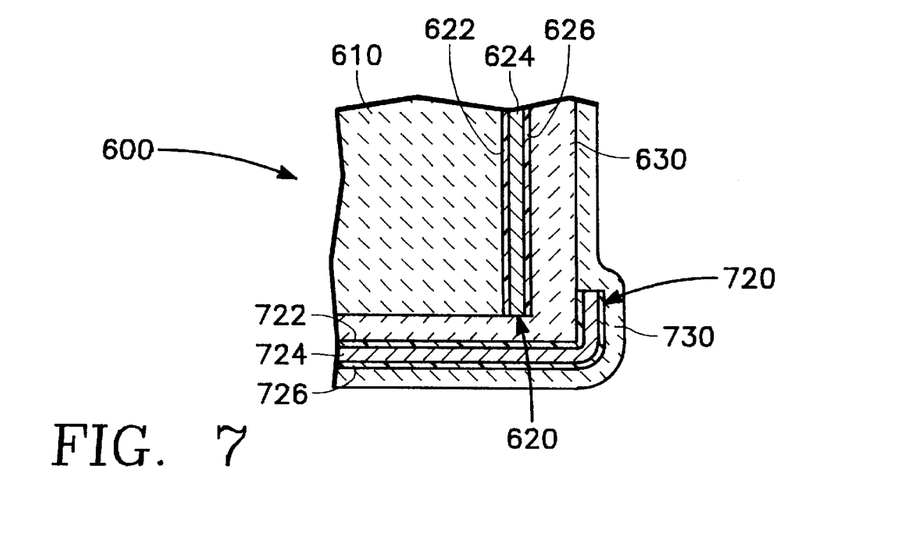
FIG. 7 is a partial cut-away side view of FIG. 6 illustrating in detail the multilayer structure of the laminated RF window of FIG. 6.

FIG. 6 shows a cylindrical embodiment 600 of the laminated RF window. The coil antenna 115 is wrapped around the cylindrical laminated RF window 600. The multilayer structure of the cylindrical laminated RF window 600 is illustrated in FIG. 7, and consists of a cylindrical-shaped alumina window body 610, a multilayer film 620 formed on the interior surface of the window body 610, including a titanium nitride film 622, a titanium film 624 and a titanium nitride film 626. An alumina protective film is formed on the interior surface of the multilayer film 620. In this example, instead of being continuous, the multilayer film 620 is divided into a sequence of patches 620a, 620b, 620c, etc. For example, each multilayer film patch 620a, 620b is a rectangle 50 mm in length and 10 mm in width. The various multilayer patches are arranged at an interval of 0.5 mm with the length direction almost perpendicular to the current direction of coil antenna 115.

Figure 8:
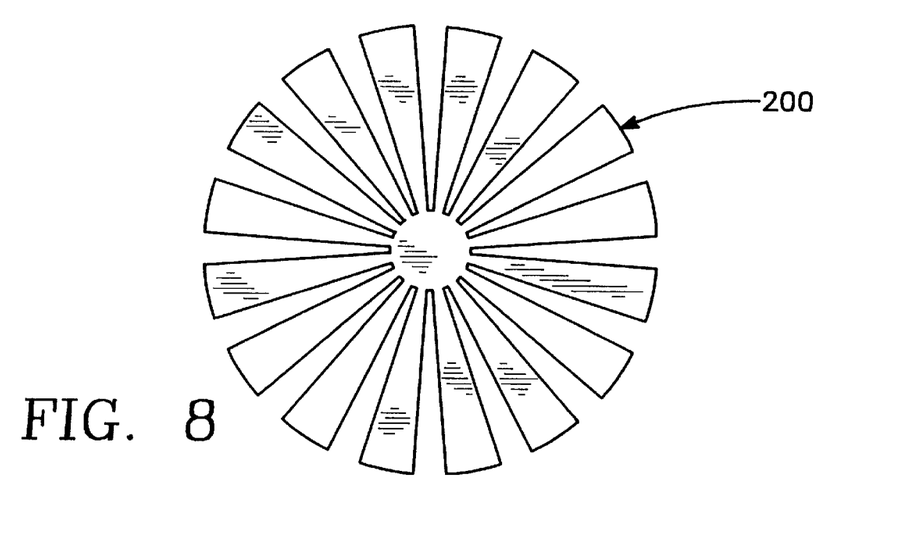
FIG. 8 is a top view of one embodiment of the conductive layer of the laminated RF window of FIG. 2.

An advantage of the divided multilayer film is that the transmissivity of the inductive RF field from the coil antenna 115 through the laminated RF window 600 is not appreciably reduced even when the titanium film 624 is relatively thick, e.g., with a thickness of 30 Angstroms. This same advantage is realized in the hemispherical laminated RF window of FIG. 2 by dividing the conductive (titanium) film 200 into radial tabs, as illustrated in the top view of FIG. 8. The area of the divided electrode 624 of FIG. 6 is reduced (relative to a continuous one) by about 5%. Therefore, the effect of increased electrode area discussed previously in this specification is reduced accordingly.

Referring again to the cut-away side view of FIG. 7, another multilayer film 720 including a titanium nitride film 722, a conductive titanium film 724 and a titanium nitride film 726 is bonded to the lower end surface of the laminated window 600. The edge portion on the inner side of the multilayer film 720 overlaps the lower end portion of the multilayer film 620. In addition, a thin silicate glass film 730 is coated to cover the multilayer film 720. A capacitor is formed between the multilayer film 620 and the multilayer film 720 and provides capacitive coupling to the wall of the reaction chamber.

Figure 9:
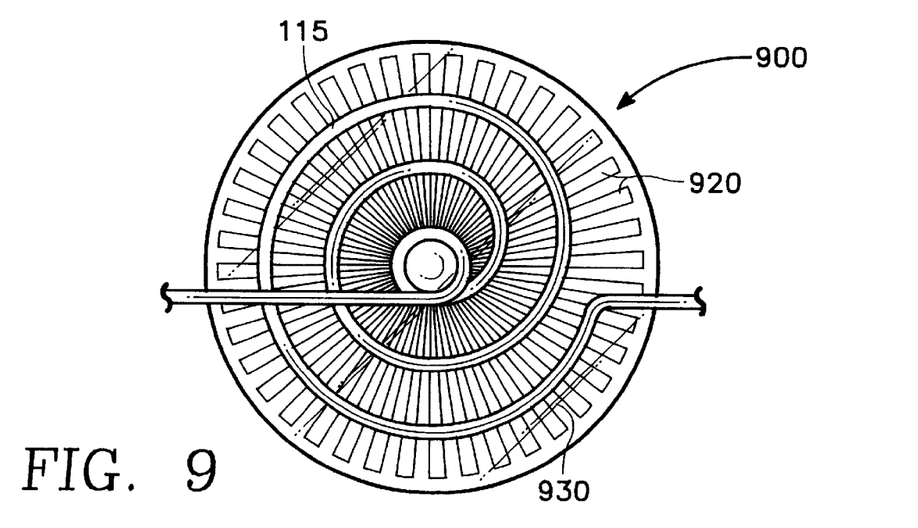
FIG. 9 is a top view of a portion of a plasma reactor incorporating a laminated RF window in accordance with a fourth embodiment of the invention.
Figure 10:
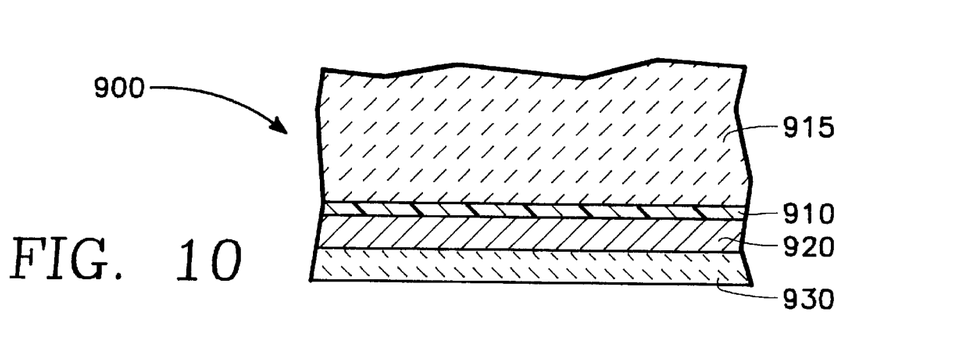
FIG. 10 is a partial cut-away side view FIG. 9 illustrating in detail the multilayer structure of the laminated RF window of FIG. 9.

FIGS. 9 and 10 are top and cut-away side views, respectively, of another embodiment of the invention in which a titanium nitride film 910 is sputtered or deposited on one surface of a flat discoid ceramic window body 915, such as alumina and titania. Subsequently, a pattern of 50-m-thick gold film 920 is formed on the titanium nitride film 910 by screen printing. This pattern consists of individual radially extending arms radiating from a common center. The gold film 920 extends radially from the center of circular window body 915 to the periphery, forming a linear pattern with a width of about 1 mm. The gold film 920 is covered by a coated silicate glass layer 930. The coil antenna 115 is arranged on the other surface of the window body in a spiral pattern.

The invention is mainly applied to dry etching devices, as well as to plasma CVD devices and other processing devices. While titanium and gold are disclosed herein as the materials of the metal film used in the laminated RF window. However, it is also possible to use other appropriate metal materials and electroconductive materials. In addition to those mentioned in the aforementioned application examples, other dielectric materials can also be used.

While the invention has been described in detail by specific reference to preferred embodiments, it is understood that variations and modifications thereof may be made without departing from the true spirit and scope of the invention.

What is claimed is:

1. An RF plasma reactor, comprising:
   a reactor chamber enclosure defining a reactor chamber interior, said enclosure comprising an RF window;
   an inductive antenna connectable to a source of RF power, said inductive antenna being on an outer side of said RF window and facing said reactor chamber interior through said RF window;
   said RF window comprising a conductive layer, said conductive layer being sufficiently thin so as to be generally transmissive to an inductive field generated by said inductive antenna.

2. The reactor of claim 1 wherein said reactor enclosure comprises conductive enclosure portions, said apparatus further comprising:
   a wafer support for holding a workpiece inside said reactor chamber interior;
   a bias RF power source having an output terminal connected to said wafer support and an RF return terminal connected to conductive enclosure portions of said reactor enclosure; and
   wherein said conductive layer of said RF window is connected to said RF return terminal.

3. The reactor of claim 2 wherein said RF return terminal is connected to RF ground, and said conductive enclosure portions and said RF window conductive layer are connected to said RF return terminal in that they are connected to RF ground.

4. The reactor of claim 2 wherein said conductive enclosure portions comprise a conductive cylindrical side wall, and said RF window comprises a ceiling generally concentric with said cylindrical side wall.

5. The reactor of claim 4 wherein said conductive layer of said RF window spans generally the diameter of said ceiling, whereby generally the entirety of the reactor enclosure above a height of said wafer support provides an RF return surface for the bias power applied to said wafer support whereby to optimize a bias power anode-to-cathode area ratio.

6. The reactor of claim 1 wherein said conductive layer is sufficiently thin in that said conductive layer has a thickness less than an RF skin depth of the inductive field of said coil antenna.

7. The reactor of claim 6 wherein said thickness is several times less than said RF skin depth.

8. The reactor of claim 7 wherein said thickness is several orders of magnitude less than said RF skin depth.

9. The reactor of claim 6, 7 or 8 wherein said RF skin depth is defined as $d=(2/\omega\mu\rho)^{1/2}$, where $\omega,\mu$ and $\rho$ represent, respectively, the angular oscillation frequency of the inductive field of the coil antenna, the permeability of the conductive layer, and the conductivity of the conductive layer.

10. The reactor of claim 1 wherein said RF window is a laminated multilayer RF window wherein said conductive layer comprises one layer of said laminated multilayer RF window.

11. The reactor of claim 10 wherein said RF window comprises:
    an outer dielectric body layer; and
    an inner protective layer, said conductive layer being between said outer and inner layers.

12. The reactor of claim 11 further comprising an underlying dielectric layer between said inner protective layer and said conductive layer and an overlying dielectric layer between said outer body layer and said conductive layer.

13. The reactor of claim 12 wherein said outer dielectric body layer and said inner protective layer comprise sintered alumina.

14. The reactor of claim 12 wherein said overlying and underlying dielectric layers comprise titanium oxide and said conductive layer comprises titanium.

15. The reactor of claim 13 further comprising conductive impurities in at least one of said outer and inner alumina layers having a concentration providing a desired capacitance.

16. The reactor of claim 11 wherein said protective layer provides a capacitance between said conductive layer an a plasma formed in said reactor chamber interior which is at least approximately equal to a capacitance of a plasma sheath between said plasma and said conductive layer.

17. The reactor of claim 16 wherein at least one of (a) thickness and (b) dielectric constant of said protective layer is selected to provide said capacitance of said protective layer.

18. The reactor of claim 17 wherein said protective layer includes a conductive impurity at a concentration corresponding to said dielectric constant.

19. The reactor of claim 1 wherein said conductive layer is sufficiently thick to minimize electric potential differences across the surface of said conductive layer.

20. The reactor of claim 19 wherein said conductive layer is sufficiently thick to provide a resistivity not greater than about 100 Ohms/square cm.

21. The reactor of claim 20 wherein said conductive layer has a thickness greater than 4 angstroms to minimize electrical potential differences across its surface and less than about 3000 angstroms to maximize transmission of the inductive field therethrough.

22. The reactor of claim 20 wherein said conductive layer has a thickness greater than 10 angstroms to minimize electrical potential differences across its surface and less than about 3000 angstroms to maximize transmission of the inductive field therethrough.

23. The reactor of claim 1 wherein said conductive layer is divided into closely spaced patches commonly connected whereby to optimize transmissivity of said inductive field therethrough.

24. The reactor of claim 1 wherein said RF window is one of: dome-shaped, hemispherical, conical, or truncated conical.

25. A plasma reactor, comprising:
a reactor enclosure defining a reactor chamber interior, said enclosure comprising a conductive layer; and
an inductive antenna external of said reactor chamber interior and facing said interior through said conductive layer and being connectable to an RF power source, said conductive layer being sufficiently thin to permit an inductive field of said inductive antenna to be coupled through said conductive layer into said reactor chamber interior.

26. The reactor of claim 25 further comprising:
a wafer pedestal for supporting a semiconductive workpiece within said reactor chamber interior, said wafer pedestal being connectable to an RF bias power supply whereby a workpiece placable on said wafer support is a bias power electrode and said conductive layer is a bias power counter electrode.

27. The reactor of claim 26 wherein said bias power electrode is biased with respect to RF ground, and wherein said conductive reactor enclosure comprising said conductive layer is grounded at said RF ground.

28. The reactor of claim 27 wherein the entirety of said reactor enclosure provides a counter electrode area for the bias power connected to said wafer support.

29. The reactor of claim 25 wherein said reactor enclosure comprises a metallic cylindrical side wall and a ceiling underlying said coil antenna, said conductive layer residing in said ceiling.

30. The reactor of claim 29 wherein said conductive layer generally spans said ceiling whereby to provide a conductive area corresponding to that of said ceiling, whereby to provide a conductive electrode area corresponding to the entire area of said reactor enclosure.

31. The reactor of claim 25 wherein said conductive layer is sufficiently thin in that said conductive layer has a thickness less than a skin depth of the inductive field of said coil antenna.

32. The reactor of claim 31 wherein said thickness is orders of magnitude thinner than said skin depth.

33. The reactor of claim 31 wherein said conductive layer is sufficiently thick to minimize electrical potential differences across said conductive layer.

34. The reactor of claim 33 wherein said conductive layer is sufficiently thick to provide an electrical resistivity of less than 100 ohms/square cm across said conductive layer.

35. The reactor of claim 34 wherein said conductive layer is between 4 and 3000 angstroms thick.

36. The reactor of claim 34 wherein said conductive layer is between 10 and 3000 angstroms thick.

37. The reactor of claim 34 wherein said conductive layer has a thickness between 1/100 and 1/10000 of said skin depth.

38. The reactor of claim 29 wherein said ceiling is a laminated multilayer RF window wherein said conductive layer comprises one layer of said laminated multilayer RF window.

39. The reactor of claim 38 wherein said RF window comprises:
a outer dielectric body layer; and
an inner protective layer, said conductive layer being between said outer and inner layers.

40. The reactor of claim 39 further comprising an underlying dielectric layer between said inner protective layer and said conductive layer and an overlying dielectric layer between said outer body layer and said conductive layer.

41. The reactor of claim 40 wherein said outer dielectric body layer and said inner protective layer comprise sintered alumina.

42. The reactor of claim 40 wherein said overlying and underlying dielectric layers comprise titanium oxide and said conductive layer comprises titanium.

43. The reactor of claim 41 further comprising conductive impurities in at least one of said outer and inner alumina layers having a concentration providing a desired capacitance.

44. The reactor of claim 39 wherein said protective layer provides a capacitance between said conductive layer an a plasma formed in said reactor chamber interior which is at least approximately equal to a capacitance of a plasma sheath between said plasma and said conductive layer.

45. The reactor of claim 44 wherein at least one of (a) thickness and (b) dielectric constant of said protective layer is selected to provide said capacitance of said protective layer.

46. The reactor of claim 45 wherein said protective layer includes a conductive impurity at a concentration corresponding to said dielectric constant.

47. A method of plasma processing a workpiece, comprising:
providing a reactor enclosure comprising a conductive layer to define a reactor interior;
applying RF power to a coil antenna located outside of said reactor interior and facing said reactor interior through said conductive layer; and
selecting said conductive layer to be sufficiently thin to be generally transparent to an inductive RF field of said inductive antenna.

48. The method of claim 47 further comprising:
constraining the thickness of said conductive layer to be not only sufficiently thin to be generally transparent to said RF inductive field but also sufficiently thick to avoid significant electrical potential differences across a surface of said conductive layer.

49. The method of claim 47 wherein providing said reactor enclosure additionally comprises:
providing a metallic chamber wall, whereby said wall and said conductive layer enclose said reactor chamber interior so that the entirety of said reactor enclosure is conductive.

50. The method of claim 47 further comprising:
supporting workpiece in said chamber interior and applying an RF bias power signal to said workpiece, whereby said workpiece is a bias electrode and said reactor enclosure is a bias counter electrode.

51. The method of claim 50 wherein said bias power is referenced to RF ground, said method further comprising grounding said reactor enclosure.

52. The method of claim 47 wherein said conductive layer has a thickness substantially less than a skin depth of the inductive field of said inductive antenna.

53. The method of claim 52 wherein said conductive layer has a thickness several orders of magnitude less than said skin depth.

54. The method of claim 48 wherein said conductive layer is sufficiently thick to have a resistivity not greater than about 100 Ohms/square cm.

* * * * *